(12) United States Patent
Currivan Incorvia et al.

(10) Patent No.: US 9,208,845 B2
(45) Date of Patent: Dec. 8, 2015

(54) LOW ENERGY MAGNETIC DOMAIN WALL LOGIC DEVICE

(71) Applicant: MASSACHUSETTS INSTITUTE OF TECHNOLOGY, Cambridge, MA (US)

(72) Inventors: Jean Anne Currivan Incorvia, Cambridge, MA (US); Marc A. Baldo, Lexington, MA (US); Caroline A. Ross, Arlington, MA (US)

(73) Assignee: MASSACHUSETTS INSTIUTE OF TECHNOLOGY, Cambridge, MA (US)

( * ) Notice: Subject to any disclaimer, the term of this patent is extended or adjusted under 35 U.S.C. 154(b) by 383 days.

(21) Appl. No.: 13/676,656

(22) Filed: Nov. 14, 2012

(65) Prior Publication Data
US 2013/0314978 A1    Nov. 28, 2013

Related U.S. Application Data

(60) Provisional application No. 61/560,082, filed on Nov. 15, 2011.

(51) Int. Cl.
H03K 19/173    (2006.01)
G11C 11/16     (2006.01)
G11C 11/14     (2006.01)

(52) U.S. Cl.
CPC ............ *G11C 11/161* (2013.01); *G11C 11/14* (2013.01); *H03K 19/1733* (2013.01)

(58) Field of Classification Search
CPC .... G11C 11/14; G11C 11/161; H01F 1/0304; H01F 1/0308; H01F 1/0315; H01F 1/12; H01F 1/143; H01F 1/147; H01F 1/14708; H01F 1/15308; H01F 1/15316; H03K 19/173; H03K 19/1733
See application file for complete search history.

(56) References Cited

U.S. PATENT DOCUMENTS

| | | | | |
|---|---|---|---|---|
| 3,638,208 A * | 1/1972 | Chow | ................... | H03K 19/168 307/407 |
| 7,242,604 B2 * | 7/2007 | Klaeui | ................... | G11C 11/15 365/145 |
| 7,532,504 B2 * | 5/2009 | Saito | ................... | G11C 11/16 257/421 |
| 7,869,266 B2 * | 1/2011 | Ranjan | ................... | G11C 11/14 365/157 |
| 7,939,869 B2 * | 5/2011 | Tsuchiaki | ................... | G11C 11/14 257/295 |
| 8,040,724 B2 * | 10/2011 | Suzuki | ................... | B82Y 10/00 365/145 |
| 8,120,127 B2 * | 2/2012 | Nagahara | ................... | B82Y 10/00 257/421 |
| 8,400,066 B1 * | 3/2013 | Pileggi | ................... | G11C 11/161 315/152 |
| 8,476,925 B2 * | 7/2013 | Zhu et al. | ................... | 326/38 |

(Continued)

OTHER PUBLICATIONS

Atkinson, D., et al. "Domain-Wall Dynamics in Magnetic Logic Devices", Spin Dynamics in Confined Magnetic Structures III, Topics Applied Physics 101, (2006), pp. 207-223.

(Continued)

*Primary Examiner* — Jason M Crawford
*Assistant Examiner* — Kurtis R Bahr
(74) *Attorney, Agent, or Firm* — Talem IP Law, LLP

(57) ABSTRACT

A logic gate device is disclosed. The logic gate device structure can include a magnetic tunnel junction on a soft ferromagnetic wire to provide a readout. One input contact can be at one end of the soft ferromagnetic wire and a second input contact can be at the other end of the soft ferromagnetic wire to control domain wall position in the soft ferromagnetic wire.

17 Claims, 13 Drawing Sheets

(56) References Cited

U.S. PATENT DOCUMENTS

| | | | | |
|---|---|---|---|---|
| 2011/0103143 A1* | 5/2011 | Ranjan | G11C 11/14 | 365/171 |
| 2011/0148458 A1* | 6/2011 | Sugibayashi | H01L 43/08 | 326/37 |
| 2011/0163402 A1* | 7/2011 | Fukami | G11C 11/14 | 257/421 |
| 2011/0254585 A1* | 10/2011 | Apalkov | H03K 19/16 | 326/37 |
| 2011/0260273 A1* | 10/2011 | Fukami | G11C 11/14 | 257/421 |
| 2012/0134199 A1* | 5/2012 | Zhu | G11C 11/16 | 365/158 |

OTHER PUBLICATIONS

Bandyopadhyay, S., et al., "Electron spin for classical information processing: a brief survey of spin-based logic devices, gates and circuits", Nanotechnology, 20 (2009) 412001 (35pp).

Fukami, S., et al., "Low-Current Perpendicular Domain Wall Motion Cell for Scalable High-Speed MRAM", 2009 Symposium on VLSI Technology Digest of Technical Papers, pp. 230-231.

Jung, Y. S., et al., "Fabrication of Diverse Metallic Nanowire Arrays Based on Block Copolymer Self-Assembly", Nano Letters, 2010, 10, pp. 3722-3726.

Wei, Z., et al., "Changing Exchange Bias in Spin Valves with an Electric Current", Physical Review Letters, 98, 116603 (2007) 4pp.

* cited by examiner

LOW ENERGY MAGNETIC DOMAIN WALL LOGIC DEVICE

BACKGROUND OF THE INVENTION

Heat generated by transistors can limit the speed of modern integrated circuits. Consequently, reducing power dissipation is one of the most important challenges in digital electronics. CMOS field effect transistors typically require voltage supplies greater than 0.5 V to fully switch from on to off. Other logic families, such as ion channels, mechanical relays, and spin-based devices, can operate at lower voltages, and thus with less wasted energy, by exploiting collective phenomena. An example is the orientation of a ferromagnetic domain in a magnetic logic system.

BRIEF SUMMARY

Logic devices based on the current-induced motion of a single domain wall within a short ferromagnetic bar (or wire) are disclosed. For the logic devices, readout can be accomplished using tunneling magnetoresistance.

In accordance with embodiments of the invention, a logic device is provided incorporating a short, narrow, soft ferromagnetic wire that is compatible with high density integration and traditional low loss electrical interconnects. A magnetic tunnel junction is on the soft ferromagnetic wire to provide a readout (output). Antiferromagnets are deposited on both ends of the wire to pin the magnetization at the ends through exchange bias, creating a single domain wall in the wire. Input contact(s) are at one end of the soft ferromagnetic wire and a clock contact is at the other end of the soft ferromagnetic wire.

One or more logic devices can be used to perform Boolean logic operations. For example, a single magnetic domain wall logic device of an embodiment can be used to perform NAND, NOR, AND, or OR operations. By combining two or more of the magnetic domain wall logic devices, more complicated logic functions can be performed.

Embodiments of the logic device satisfy the practical requirements for concatenability and gain and are projected to scale to low supply voltages.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 1A illustrates an ON state of the structure and FIG. 1B illustrates an OFF state of the structure.

FIG. 1C illustrates an ON state of the structure and FIG. 1D illustrates an OFF state of the structure.

DETAILED DISCLOSURE

Figure 1A:
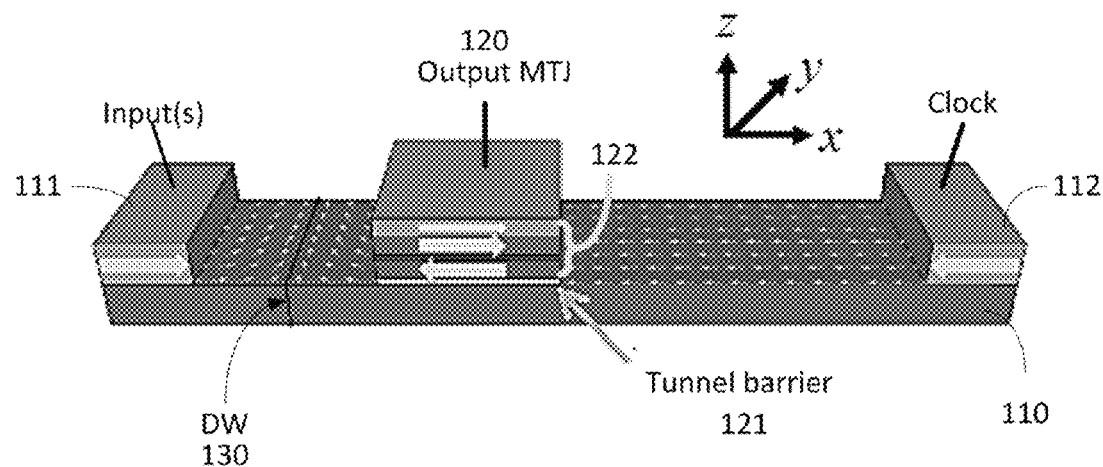
FIGS. 1A and 1B show a logic gate structure in accordance with an embodiment of the invention where the ON and OFF states of the structure are determined by the magnetization of the soft layer under the magnetic tunnel junction (MTJ).

Magnetic domain wall based logic devices and circuits are described herein that can operate at a low switching energy.

A magnetic domain wall based logic gate can have three terminals: an input terminal, an output terminal, and a clock terminal. The input and clock terminals can be at opposite ends of a soft ferromagnetic wire. The output can be sensed by a magnetic tunnel junction located between the ends of the soft ferromagnetic wire. The magnetic tunnel junction can be on a central region of the soft ferromagnetic wire. The state of the device can be read through sensing the ON and OFF currents from movement of a domain wall under the magnetic tunnel junction.

A soft magnet is a material that has a low coercivity. Low coercivity indicates that the magnitude of an external field required to bring the magnetization of the material down to zero after saturation is small. A soft magnet also has a small remanence, meaning that the material's remaining magnetization after switching off an external magnetic field is small.

A magnetic tunnel junction is formed of a thin insulating material between two ferromagnets. Electrons tunnel through the insulating material between the two ferromagnets when a bias voltage is applied. The tunneling current depends on the relative orientation of magnetizations of the two ferromagnetic layers, which may be controlled by an applied magnetic field or an applied current.

In a ferromagnetic wire, an individual domain of the wire is a region where the net spin of the atoms in the material are aligned approximately parallel, even when no external field is applied, as long as the material is kept below its Curie temperature. When an external magnetic field is applied, domains with their magnetization close to the direction of the external magnetic field increase in size. A domain wall refers to the transition region between adjacent domains.

The device can be configured for perpendicular magnetic anisotropy (PMA) or in-plane magnetic anisotropy (IMA). That is, the magnetization of the soft ferromagnetic wire can be normal (perpendicular) or parallel (in-plane) to the plane of the magnetic film (or "wire") of the device.

In one embodiment, a device having an IMA configuration can be formed of NiFe, for example as $Ni_{80}Fe_{20}$. A tantalum (Ta) adhesion layer can be provided below the NiFe soft ferromagnetic wire on a substrate. One arrangement of an IMA configured material can include a 10 nm $Ni_{80}Fe_{20}$ wire formed on a $Si/SiO_2$ substrate with a 2 nm Ta barrier layer between the NiFe and the substrate. Table 1 illustrates the in-plane magnetic anisotropy for this configuration. Hc is the coercivity for a field applied in plane, Hk the anisotropy field needed to orient the magnetization perpendicular to the sample plane, and Ku is the corresponding magnetic anisotropy.

TABLE 1

| $H_c$ (Oe) | $H_k$ (Oe) | $K_u$ in-plane (erg/cm³) |
|---|---|---|
| 9.0 ± 1 | 1.38 ± 0.01 × 10⁴ | 5.52 ± 0.04 × 10⁶ |

In another embodiment, a device having a PMA configuration can be formed of a CoFe/MgO structure, for example as $Co_{50}Fe_{50}$/MgO. Other perpendicular materials that can be used include CoFeB (for example in the form of $Co_{60}Fe_{20}B_{20}$ or $Co_{40}Fe_{40}B_{20}$) and Co/Pt multilayers. A tantalum (Ta) adhesion layer can be provided below the CoFe/MgO (or other material) soft ferromagnetic wire on a substrate. One arrangement of a PMA configured material can be a 0.8 nm thick $Co_{50}Fe_{50}$ layer formed on a $Si/SiO_2$ substrate with a 5 nm Ta layer between the CoFe layer and the substrate, and a 1.8 nm MgO layer formed on the CoFe layer. Table 2 illustrates the perpendicular magnetic anisotropy for this configuration. Hc is the coercivity for a field applied out of plane, Hk the anisotropy field needed to orient the magnetization into the sample plane, and Ku is the corresponding magnetic anisotropy.

TABLE 2

| $H_c$ (Oe) | $H_k$ (Oe) | $K_u$ out of plane (erg/cm³) |
|---|---|---|
| 10.5 ± 0.5 | 1.86 = 0.03 × 10⁴ | 8.9 ± 0.4 × 10⁶ |

According to certain embodiments, the wire can be formed as an asymmetric stack (e.g., using different thicknesses for layers of a multi-layer structure) or a thin film can be deposited on the soft ferromagnetic wire to form the asymmetric stack. The thin film can include Ta, MgO, or the like that is on the ferromagnetic material either in select regions (such as below the MTJ) or along the entire wire. For example, instead of only having MgO under the tunnel junction readout, the MgO can be kept on top of a portion of the wire and even the entire wire to create a stack Ta/Magnetic Layer/MgO.

Figure 1B:
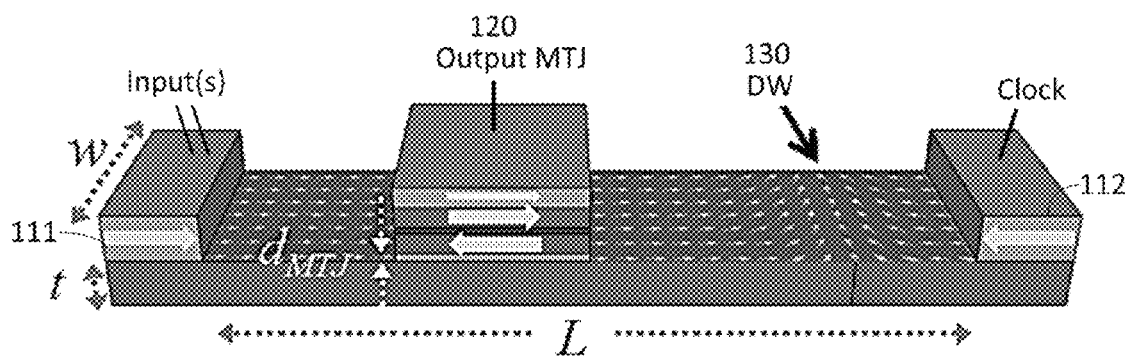
Figure 1C:
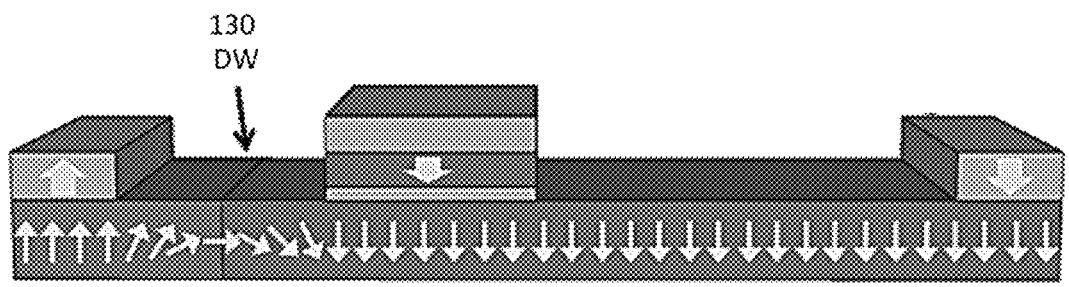
FIGS. 1C and 1D show a logic gate structure in accordance with another embodiment of the invention where the ON and OFF states of the structure are determined by the magnetization of the soft layer under the magnetic tunnel junction (MTJ).
Figure 1D:
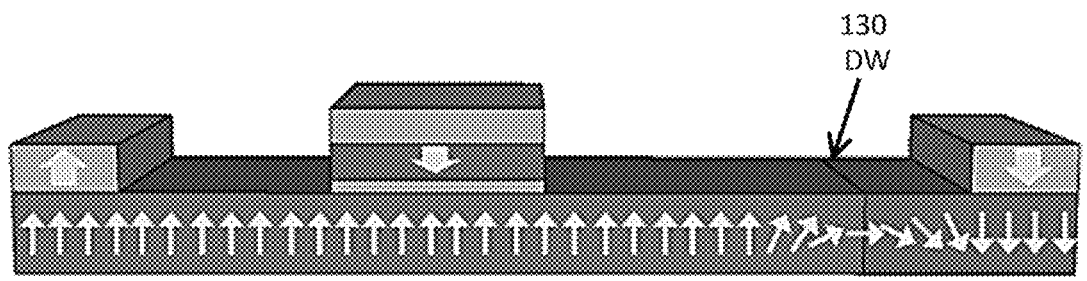

An embodiment of the magnetic domain wall logic gate is shown in FIGS. 1A and 1B. Another embodiment of the magnetic domain wall logic gate is shown in FIGS. 1C and 1D. In the embodiment shown in FIGS. 1A and 1B, an in-plane magnetic anisotropy material is used as the soft ferromagnetic material, whereas in the embodiment shown in FIGS. 1C and 1D, a perpendicular magnetic anisotropy material configuration is shown.

Referring to FIGS. 1A and 1B, a magnetic domain wall logic gate device is formed by a soft ferromagnetic wire 110 with Input and Clock contacts 111, 112 placed on or near antiferromagnetic pads, and a magnetic tunnel junction (MTJ) 120 at the Output. The MTJ 120 includes a tunnel barrier 121 and a synthetic antiferromagnetic (SAF) stack 122. The SAF may be provided by a structure having a thin ruthenium layer between two magnetic layers such as CoFeB/Ru/CoFeB. Its purpose is to partly or fully eliminate the stray field from the hard layer of the MTJ which could interfere with the motion of the domain wall. The ON and OFF states are determined by the magnetization of the soft layer under the MTJ.

For example, the ON or OFF state of the logic gate is determined by the position of a single domain wall (DW) 130 in the soft ferromagnetic wire 110. The soft ferromagnetic wire 110 can be an IMA material such as $Ni_{80}Fe_{20}$ (NiFe). The use of a single DW 130 mitigates complications due to stray field interaction between multiple domain walls.

According to one embodiment, the length of the wire, L, is greater than the width w and thickness t. For sub-100 nm linewidth, the domain wall is transverse and the magnetization direction $\hat{M}$ of the wire is confined in the (x,y) plane, allowing distinct $+\hat{x}$ or $-\hat{x}$ states in the central part of the wire depending on the domain wall position. FIGS. 1C and 1D instead have distinct $+\hat{z}$ or $-\hat{z}$ states. To ensure that only one domain wall is present, antiferromagnetic contacts such as IrMn can be placed on both ends of the wire, creating exchange bias that pins $\hat{M}$ at the ends.

The gate operation includes a write cycle and a read/reset cycle (illustrated for a shift register in more detail in FIGS. 9B-9J). During the write process, current injected into the 'Input(s)' contact 111 is spin-polarized and translates the domain wall 130 along $\hat{x}$, switching the gate from the ON state, e.g., providing a logical ONE, (FIGS. 1A and 1C) to the OFF state, e.g., providing a logical ZERO, (FIGS. 1B and 1D). More than one current-carrying input wire at the Input contact 111 can be used.

The domain wall 130 is translated by spin torque transfer, given by the Landau-Lifshitz-Gilbert equation $$\frac{\partial \vec{m}}{\partial t} = -\gamma \vec{m} \times \vec{H}_{eff} + \alpha \vec{m} \times \frac{\partial \vec{m}}{\partial t} - u\frac{\partial \vec{m}}{\partial x} + \beta u \vec{m} \times \frac{\partial \vec{m}}{\partial x}$$

where $\vec{m}$ is magnetization, t time, x distance, $\gamma$ the gyromagnetic ratio, $\vec{H}_{eff}$ the effective field, $\alpha$ the damping constant, $\beta$ the nonadiabatic term, and spin current density $$u = \frac{jg\mu_B P}{2eM},$$

with j the current density, g the Landé g-factor, $\mu_B$ the Bohr magneton, e electron charge, and P the polarization. The magnetization of the domain wall cants while it moves, but oscillations in its structure and velocity may be avoided by operating the device at current densities well below Walker breakdown.

It has been observed experimentally that current-induced domain wall motion can exhibit a threshold behavior, where the domain wall will only move when the applied current exceeds a threshold value. The threshold can be determined by extrinsic pinning sites such as notches in the wire, local magnetic fields, or local minimums in the energy landscape, for example, created by the presence of antiferromagnets. Such nonlinear behavior allows the gate to have distinct OFF and ON currents.

Figure 2A:
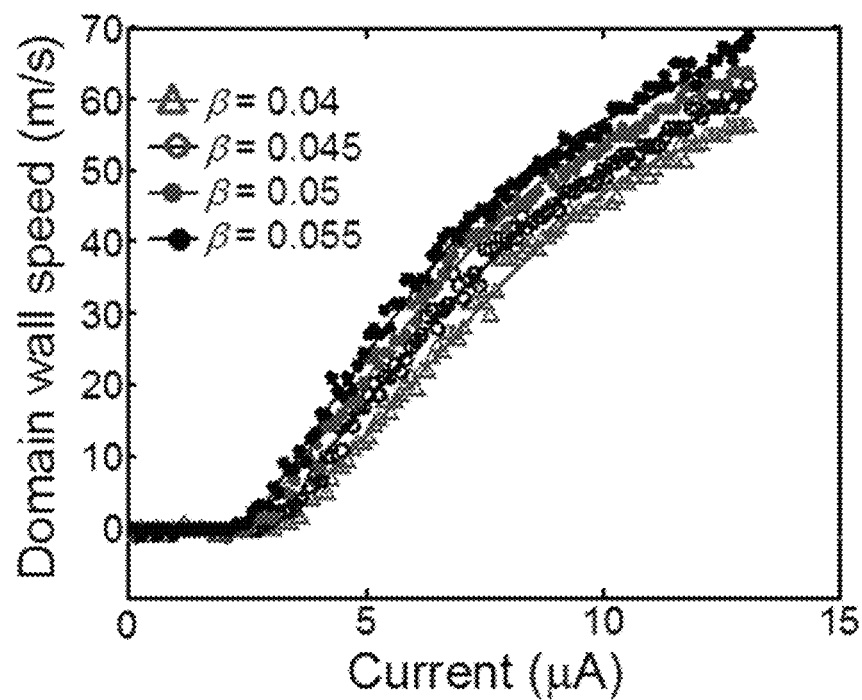
FIG. 2A is a simulation plot of domain wall speed in the soft ferromagnet illustrated in FIG. 1A in accordance with an embodiment of the invention versus current applied at the Input, for L=180 nm, w=5 nm, and t=2.5 nm.

The average domain wall speed versus the applied current for L=180 nm, t=2.5 nm, and w=5 nm is modeled in FIG. 2A for an in-plane anisotropy device. Although these are small dimensions, fabrication of sub-10 nm metallic wires can be accomplished via methods such as described by Jung et al. ("Fabrication of Diverse Metallic Nanowire Arrays based on Block Copolymer Self-Assembly," *Nano Lett.* 2010, 10, 3722-6). As shown in FIG. 2A, the domain wall starts to move above a threshold current $I_T \approx 3$ µA. That is, currents above $I_T \approx 3$ µA push the domain wall and switch the device.

Thus, if two wires are input at the Input terminal (e.g., two input connections), the device acts as a logical NAND: only when both input currents sum above a threshold ($I_{critical}$) will the device switch from FIG. 1A to FIG. 1B.

According to an embodiment, in order for the device to act as a logical NOR, the width of the wire is decreased such that the threshold current is half that provided for the NAND configuration. For example, in the in-plane anisotropy case the width can be decreased from 5 nm to a smaller width in order to reduce the threshold current ($I_T = I_{critical}$) to about 1.5 µA.

Figure 3A:
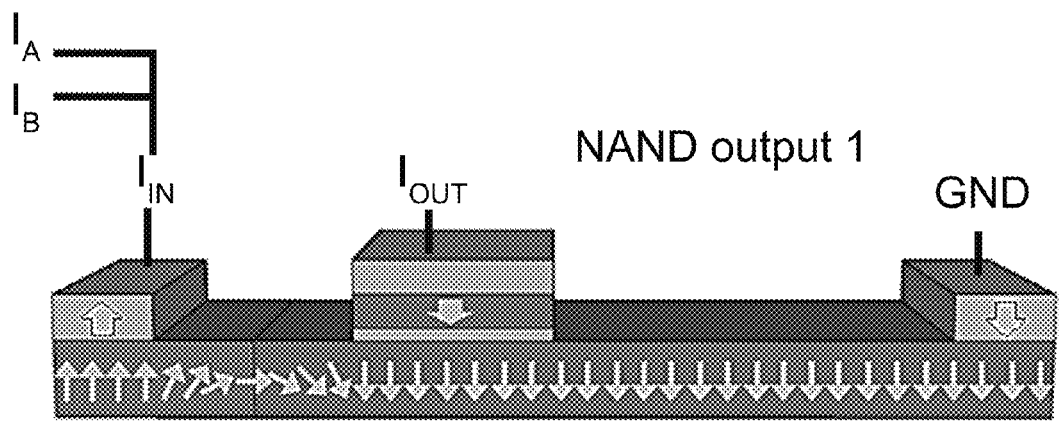
FIGS. 3A and 3B show a logic gate structure according to an embodiment of the invention where a logical NAND operation is implemented.
Figure 3B:
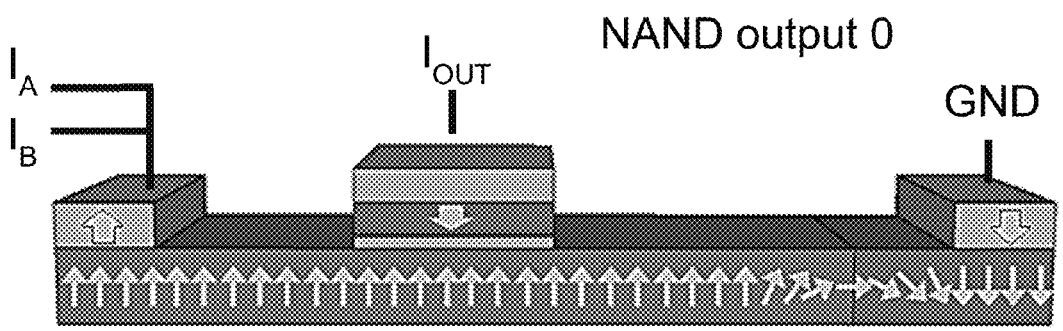

FIGS. 3A and 3B illustrate the logical NAND operation in which two input currents $I_A$ and $I_B$ are applied to the input ($I_N$) and ground (GND) is connected to the opposite end of the ferromagnetic wire. When $I_A + I_B > I_{critical}$, a switch from a logical output 1 to a logical output 0 can occur. Table 3 shows the logical values for the two wire inputs ($I_A$, $I_B$) and resulting output ($I_A$ NAND $I_B$).

TABLE 3

| $I_A$ | $I_B$ | $I_A$ NAND $I_B$ |
|---|---|---|
| 0 | 0 | 1 |
| 0 | 1 | 1 |
| 1 | 0 | 1 |
| 1 | 1 | 0 |

Returning again to FIG. 2A, as the current increases above $I_T$ the domain wall speed monotonically increases with current until Walker breakdown. $I_T$ is inversely proportional to the non-adiabatic damping parameter, β. The threshold behavior provides distinct ON/OFF currents in the switch and can be engineered via the non-adiabatic damping parameter β and via external pinning sites.

Figure 2B:
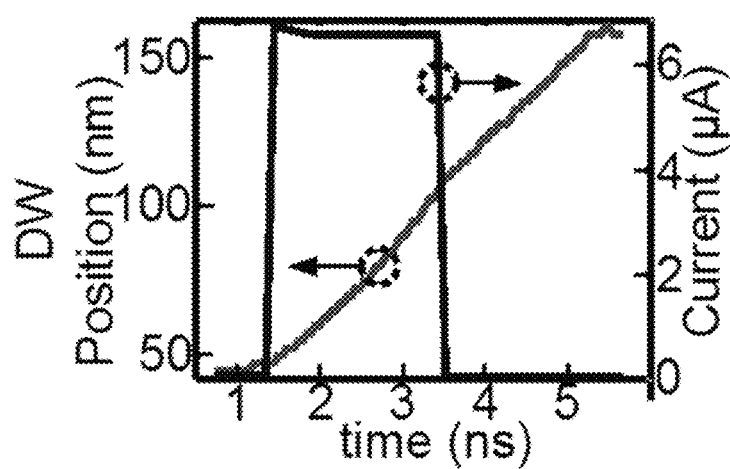
FIG. 2B is a graph of domain wall position and current pulse transients of a logic gate structure in accordance with an embodiment of the invention, showing the domain wall behavior as it is pushed across the short magnetic bar.

As shown in FIG. 2B, the domain wall (DW) accelerates during a current pulse, after which the domain wall continues to drift across the magnetic bar as it dissipates energy, until it gets caught in the next energy minimum.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE

Gate Behavior Modeling

The state of the logic gate is read using a magnetic tunnel junction (MTJ), which as described above with respect to FIGS. 1A and 1B, can include an insulating tunnel barrier 121 (e.g. MgO) and a synthetic antiferromagnetic stack (SAF) 122. The SAF can include an antiferromagnetically coupled pair of single domain ferromagnets deposited on top of the insulating barrier, each with a fixed magnetization $\hat{M}_{hard}$. The SAF structure minimizes stray fields that could impede the motion of the domain wall in the soft layer.

To sense the magnetization $\hat{M}_{soft}$ of the soft layer directly beneath the MTJ, a voltage $V_{CLK}$ can be applied to the 'Clock' terminal (112 of FIG. 1A). For both magnetic anisotropy configurations, the output current $I_{OUT}$ through the MTJ is high ($I_H$) when $\hat{M}_{soft}$ is parallel to $\hat{M}_{hard}$ and low ($I_L$) when the magnetizations are antiparallel. The difference between the MTJ resistance in the parallel and antiparallel states, $R_P$ and $R_{AP}$, is characterized by the tunnel magnetoresistance TMR= $(R_{AP}-R_P)/R_P$. TMR values up to 600% have been observed at room temperature depending on the materials used and the tunnel barrier quality; $R_P$ decreases with the barrier thickness d. Prior investigations into tunnel barriers with cross sections as small as 50 nm×100 nm suggest that scaling to tens of nm dimensions is possible.

The position of the domain wall is non-volatile, thus it is reset prior to the gate's next operation. In this architecture, the reset operation is performed together with the read step. Current from the Clock terminal flows into the MTJ, reading out the state of the device, but also pushes the domain wall back towards the Input terminal. The MTJ is physically offset towards the Input terminal so that the output conductance is preserved for the maximum amount of time before the gate fully resets.

To study the behavior of this device in a circuit, an iterative model was constructed using a SPICE circuit simulator and micromagnetic simulations with α=0.01, β=0.05, and standard materials parameters for NiFe ($Ni_{80}Fe_{20}$ saturation magnetization 800 kA/m, exchange stiffness $13 \times 10^{-12}$ J/m, and magnetocrystalline anisotropy 500 J/m$^3$). The equivalent SPICE circuit is shown in FIG. 4, and enables modeling of leakage current between gates.

Figure 4:
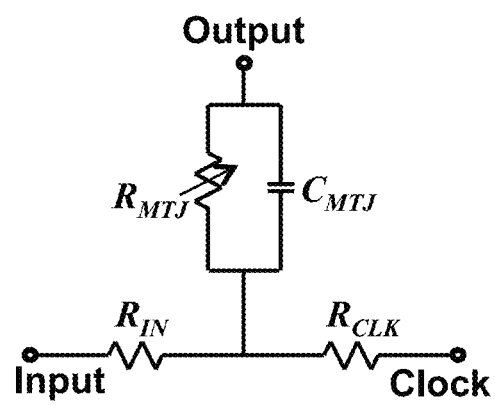
FIG. 4 is an equivalent circuit model for the logic gate device of an embodiment of the invention.

Referring to FIG. 4, to model the device in a circuit, the soft layer (e.g., wire 110 of FIG. 1A) is represented by resistances $R_{IN}$ and $R_{CLK}$. The MTJ is modeled by a variable resistor $R_{MTJ}$ and a capacitor $C_{MTJ}$. For an MgO tunnel barrier with thickness d=1 nm and area A=7.5 nm×20 nm, $C_{MTJ} \approx 30$ aF, which is small enough to neglect.

While the micromagnetic simulation includes a small random anisotropy, it does not include temperature effects or edge roughness. Thermal vibrations at room temperature can reduce the threshold current. Edge roughness can increase the threshold current slightly in studies of narrow magnetic wires if the potential wells created by the edges are significant. A method to minimize edge roughness is provided in the example entitled "Reducing edge roughness". The simulation shows a threshold current density, which is attributed to the pinning of the domain wall near the antiferromagnetic pads, where the spins are fixed.

To model the logic gate within a circuit, the tunnel magnetoresistance is defined as TMR=$(R_{AP}^*-R_P^*)/R_P^*$, where $R_P^*(R_{AP}^*)$ is the effective output resistance in the ON (OFF) state: $R_P^*(R_{AP}^*)=R_p(R_{ap})+R_{CLK}+R_{INTERCONNECT}$. During operation of the gate, TMR>$(I_{ON}/I_{OFF}-1)$. The fan-out, F, of the gate is F=$V_{CLK}/(I_{ON}R_P^*)$.

Figure 5:
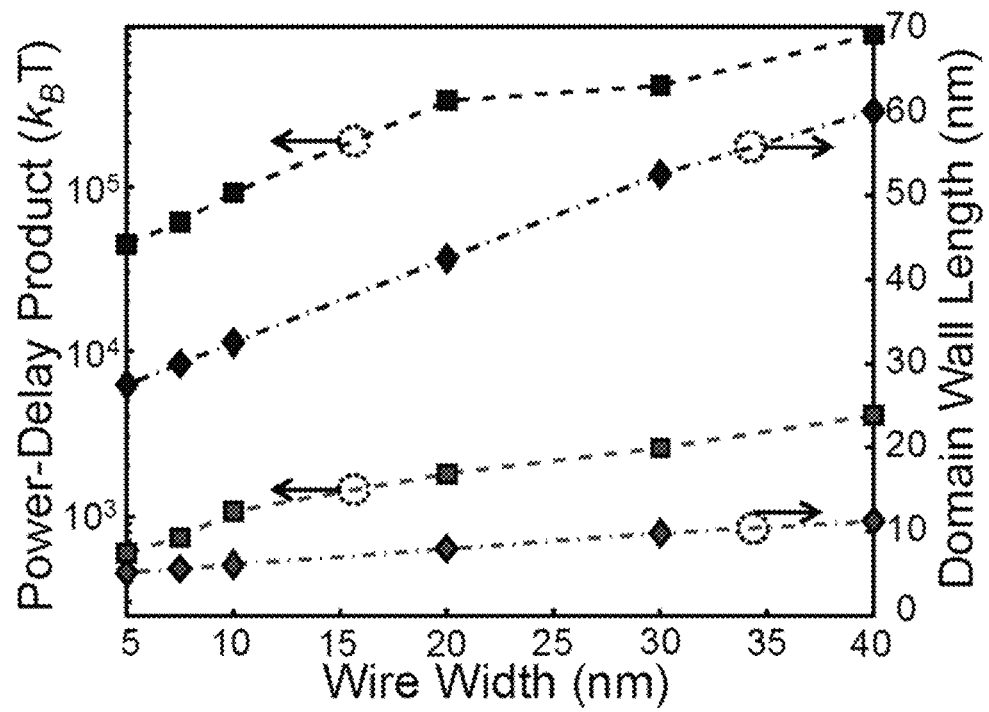
FIG. 5 is a plot of gate scaling behavior, including gate width (e.g., width of the ferromagnetic wire) vs. input energy (power-delay product) and the gate width vs. domain wall length $L_{DW}$ (full width at half maximum), for a device in accordance with an embodiment of the invention. The top two curves are for in-line magnetic anisotropy devices such as illustrated in FIGS. 1A-1B, and the bottom two curves are for perpendicular anisotropy devices such as illustrated in FIGS. 1C-1D.

FIG. 5 is a plot of gate scaling behavior, including gate width (e.g., width of the ferromagnetic wire) vs. input energy (power-delay product) and the gate width vs. domain wall length $L_{DW}$ (full width at half maximum), for a device in accordance with an embodiment of the invention. In FIG. 5, the length and thickness of the wire are fixed at L=180 nm and t=2.5 nm, and the width of the wire w is varied from 40 nm to 5 nm. The top two curves are for in-plane magnetic anisotropy devices such as illustrated in FIGS. 1A-1B, and the bottom two curves are for perpendicular magnetic anisotropy devices such as illustrated in FIGS. 1C-1D. The curve with the arrow directed to the energy axis plots the input energy required to push the domain wall and switch the state of the 2-input, 1-output NAND gate, i.e. the power-delay product. A MTJ length $L_{MTJ}$=15 nm and domain wall length $L_{DW}$ are assumed, and a gate is considered switched when its domain wall moves $L_{DW}+2\times L_{MTJ}$. At w=5 nm, the perpendicular magnetic anisotropy power-delay product is $4.8\times10^2$ $k_BT$ where $k_BT$ is the thermal energy at room temperature. This does not include power consumption from the clock source.

The simulation value of the power-delay product ($4.8\times10^2$ $k_BT$) compares to a typical energy consumption of $5.8\times10^4$ $k_BT$ in one CMOS transistor as of the ITRS 2010 update, with four CMOS transistors making a NAND gate. The CMOS and domain wall-based devices have similar areas (~1000 nm$^2$), although the magnetic device is much narrower. Accordingly, the micromagnetic model shows that the energy required to drive the domain wall (power-delay product) scales well with the width of the soft layer, down to energies competitive with contemporary CMOS logic.

In FIG. 5, the plotted curve with the arrow directed at the domain wall length axis shows that the length of the domain wall also scales with w, reaching 28 nm for w=5 nm for the in-plane magnetic anisotropy devices and reaching less than 10 nm for the perpendicular magnetic anisotropy devices. The domain wall length sets the limit on the length of the device, since the domain wall has to move (be pushed) at least its own length to switch the gate (output).

EXAMPLE

Circuit Architecture: Shift Register Using Three Gates in Series

The circuit architecture, as well as the simulated frequency response and logic performance, is demonstrated in FIGS. 6A-6D. Using the states shown in FIGS. 1A and 1B (or FIGS. 1C and 1D or FIGS. 3A and 3B), the gate can implement either a NAND or a NOR operation.

Figure 6A:
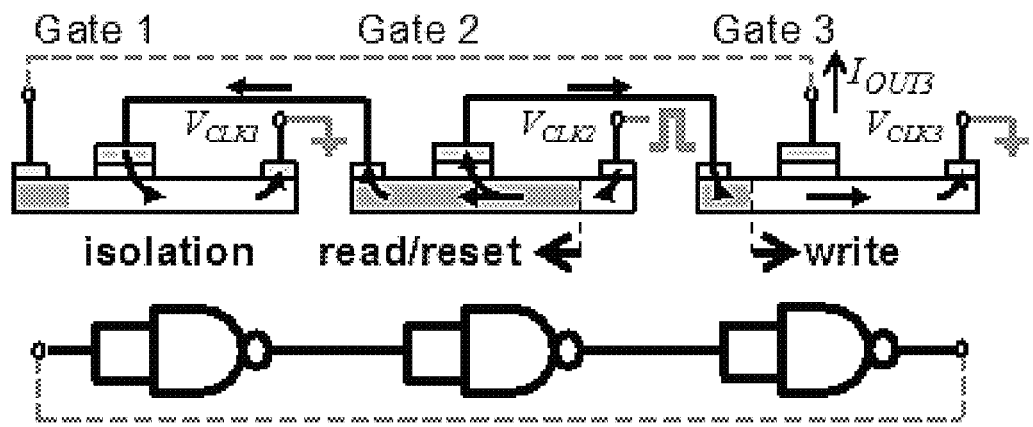
FIG. 6A is a schematic representation of the circuit architecture for a shift register in accordance with an embodiment of the invention.

During the write operation the Clock terminal is grounded, such as shown with respect to Gate 3 in FIG. 6A (see also FIG. 3A). Provided that the input impedance is sufficiently low, the device sums the currents injected into the Input terminal. For a device such as shown in FIG. 3A, the device can receive two input currents. The shift register shown in FIG. 6A is implemented using a single input (to the two inputs of the input contact) from a previous gate. The two input currents are either high or low ($I_H$ or $I_L$), depending on the conductance of the MTJ in the previous gate. If $2I_H>I_T$ and $I_L+I_H<I_T$ then the gate performs a NAND operation. If $2I_L<I_T$ and $I_L+I_H>I_T$ then the gate performs a NOR operation. By reversing the magnetization in the SAF of the MTJ, the gate can perform AND and OR operations. Here, the circuits are implemented using NAND gates and buffers (single input AND/OR gates). Of course, it should be understood that embodiments are not limited thereto.

FIG. 6A shows the circuit architecture of three gates connected in series. A gate-level diagram of the three devices is shown below the device level structure. Logic propagation occurs in two steps. During the read step of Gate 2, $V_{CLK2}$ is pulsed while $V_{CLK1}$ and $V_{CLK3}$ remain at ground. Each sequential clock pulse propagates the logic operation and powers the circuit. The arrows represent electron flow through the MTJ, reading Gate 2 and eventually resetting domain wall 2, while writing Gate 3. Current also flows back into Gate 1, but it has been previously reset and is in an isolated state, thus this "leakage" current does not affect the logic position of Gate 1. Since each gate is controlled by two independent clocks, the gates can have gain. To simulate the frequency response, a shift register is modeled with three 1-fan-out NAND gates in series, setting L=180 nm, t=2.5 nm, and w=5 nm, and $I_{OUT3}$ connected back to the input terminal of Gate 1.

Figure 6B:
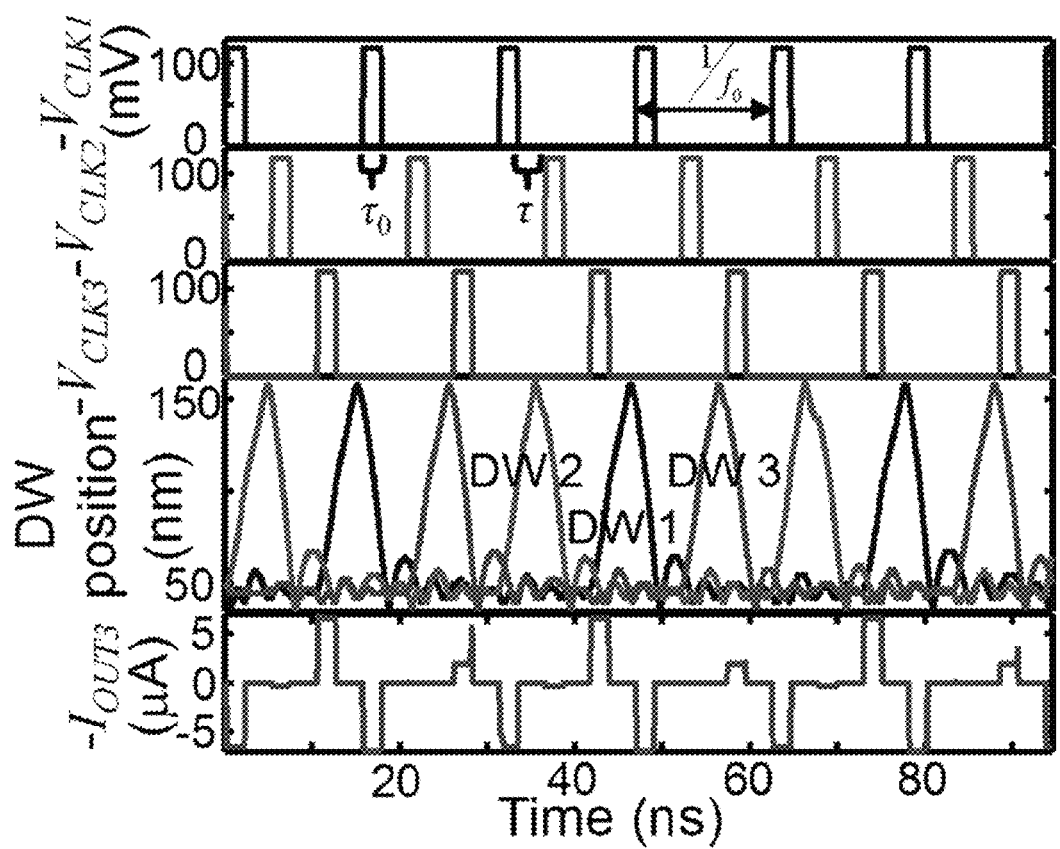
FIG. 6B shows a simulation plot of the pulse clocking scheme clock voltage transients ($-V_{CLK1}$, $-V_{CLK2}$, $-V_{CLK3}$), the domain wall positions for each logic gate (DW), and the output current ($-I_{OUT3}$) for the shift register of FIG. 6A in accordance with an embodiment of the invention.

FIG. 6B shows the clock pulses, domain wall positions, and $I_{OUT3}$ transients. Each clock supplies a voltage pulse of $V_{CLK}$=120 mV for $\tau_0$=2 ns and a wait time of $\tau$=3 ns before the next gate is clocked, with a ramp time of 0.1 ns, giving a switching time of 5.2 ns (192 MHz) for each gate. The wait time $\tau$ is employed to turn off the driving voltage pulse once the domain wall reaches the MTJ. The domain wall continues to propagate across the MTJ during $\tau$. The graph of domain wall position versus time shows that each domain wall pushes ~100 nm before being reset. After the reset, the domain wall oscillates about its original position as it dissipates excess energy. FIG. 6B shows the current $I_{OUT3}$ as it oscillates at the driving frequency $f_0$ between high and low currents of 6.5 µA and 2.0 µA, respectively. The low current pulse occasionally exhibits a high spike, due to the domain wall passing the MTJ before the conclusion of the driving clock pulse, but it does not appreciably affect the domain wall in the following gate. The periodic negative pulses in the current output occur when the gate is in isolation and current is flowing backwards from the subsequent gate that is in the read/reset state.

Figure 6C:
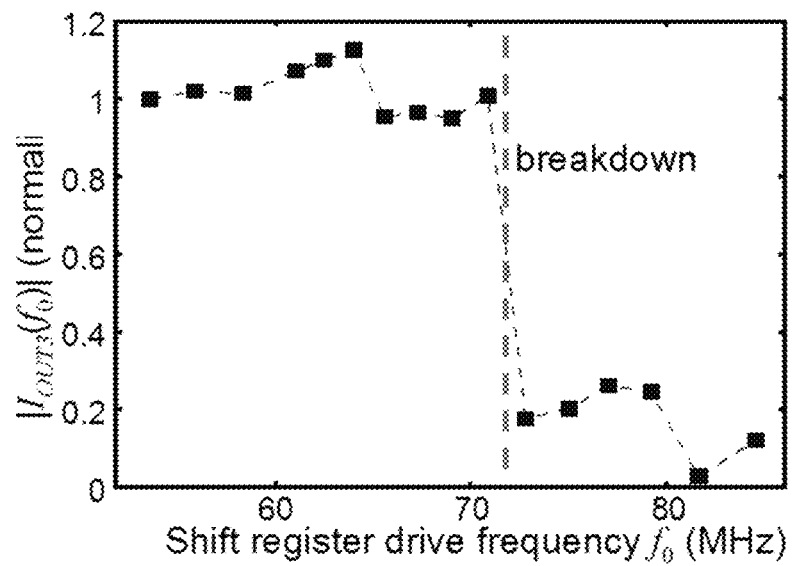
FIG. 6C shows a plot of the frequency component of $I_{OUT}$ at the drive frequency $f_0$ with $\tau_0$=2 ns and $V_{CLK}$=120 mV fixed for the shift register of FIG. 6A in accordance with an embodiment of the invention.

In FIG. 6C the magnitude of the frequency component of $I_{OUT3}$ is plotted at the driving frequency $f_0$ with $\tau_0$=2 ns and $V_{CLK}$=120 mV fixed, As shown in FIG. 6C, the shift register breaks down above ~70 MHz. While this is at least an order of magnitude slower than CMOS, these gates have been optimized for energy consumption. Higher speeds can be possible if power dissipation is increased to move the domain wall faster. Indeed, the operating frequency under a sinusoidal drive is higher than the pulsed clock due to the increase in duty cycle and power dissipation. The domain wall velocity in NiFe wires can be up to 100 m/s; thus the switching speed can theoretically be 1 GHz in a 100 nm long wire, and higher in shorter wires. There are four distinct regions in the breakdown behavior. When $f_0$<30 MHz, $I_{OUT3}$ matches the clocking frequency. When 30 MHz<$f_0$<33 MHz, the frequencies match, but Gate 2's domain wall has not completely reset when Gate 3's read cycle starts, thus Gate 2's MTJ has a slightly higher resistance, and more current flows out of Gate 3, slightly increasing $I_{OUT3}$. When 33 MHz<$f_0$<36.5 MHz the oscillator occasionally skips a cycle, and the input and output frequencies do not perfectly match. For $f_0$>36.5 MHz, the oscillator completely breaks down.

Figure 6D:
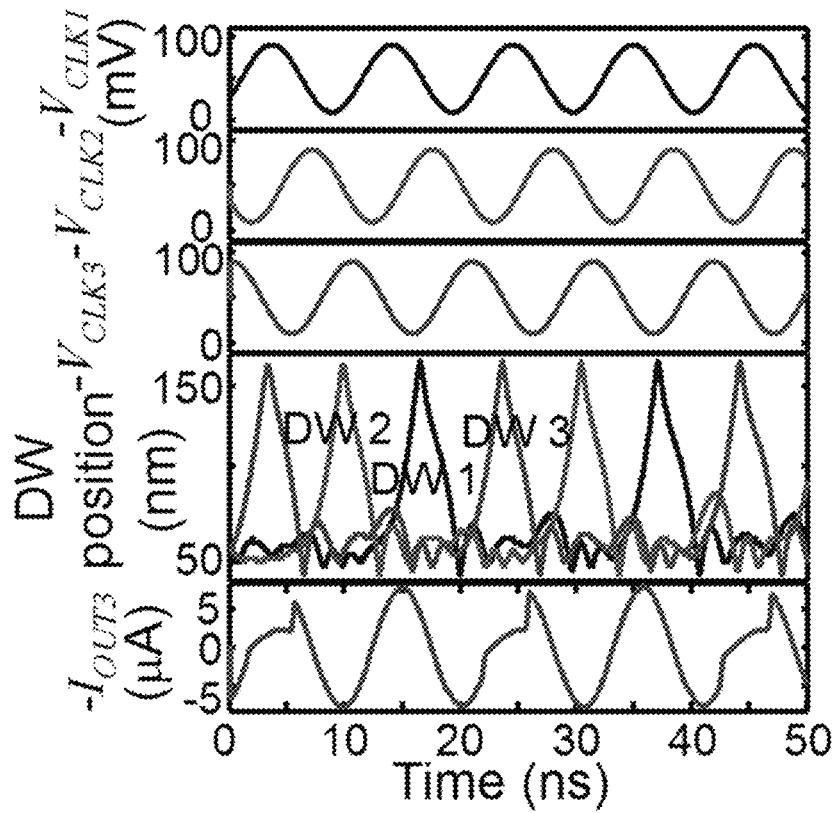
FIG. 6D shows a simulation plot of the sinusoidal clocking scheme 96 MHz sinusoidal clocks ($-V_{CLK1}$, $-V_{CLK2}$, $-V_{CLK3}$), the domain wall positions for each logic gate (DW), and the output current ($-I_{OUT3}$) for the shift register of FIG. 6A in accordance with an embodiment of the invention.

The circuit used to generate the voltage-pulse clocks shown in FIG. 6B could rely on RF pulse transformers to produce low voltage, high current pulses for global distribution to multiple gates. An even simpler scheme is shown in FIG. 6D. In this case each gate is supplied with a 96 MHz sinusoidal clock with amplitude 0.08 V; each successive clock has a 120° phase shift from the previous one. This global three-phase sinusoidal clock can also be readily generated using RF transformers or equivalent. The domain wall positions and $I_{OUT3}$ transients are correctly reproduced, with a switching time of 4.3 ns (233 MHz). The example shown operates at $f_0$=96 MHz, and breakdown occurs around $f_0$=100 MHz.

EXAMPLE

Full Adder

Figure 7A:
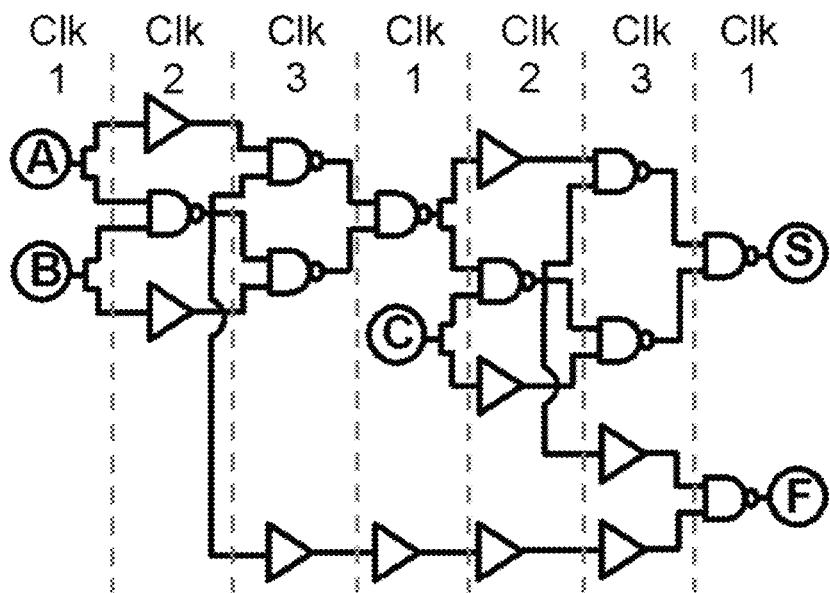
FIG. 7A shows a circuit diagram of a full adder in accordance with an embodiment of the invention.

In FIG. 7A a full adder is modeled as an example of a more complex circuit. Referring to FIG. 7A, the adder has input bits A, B, and C, and output bits S and F, where S+2×F=A+B+C. The gates in each column clock together. To demonstrate gates with varying fan-outs, showing the gates have power gain, the circuit includes two 3-fan-out NAND gates, one 2-fan-out NAND gate, six 1-fan-out NAND gates, and nine buffer elements, with interconnects modeled by 1.8 kΩ resistors.

In the model, it is assumed that TMR=300%, tunnel barrier area=150 nm$^2$, and values of d given in Table 4 (where $d_{MTJ}$ are estimated based on experimental results described by Yuasa et al., *Nat. Mater.* 2004, 3, 868-871).

TABLE 4

Circuit Elements used in the Full Adder

| gate | w (nm) | t (nm) | L (nm) | $d_{MTJ}$ (nm) | $R_{MTJ}$ (kΩ) | $R_{IN}$, $R_{CLK}$ (kΩ) (from FIG. 1d) | $I_{ON}$ (μA) | MTJ hard ferromagnet |
|---|---|---|---|---|---|---|---|---|
| 1 Fan-out NAND | 7.5 | 2.5 | 180 | 0.95 | 10 | 1.0, 1.6 | 12 | ← |
| 2 Fan-out NAND | 7.5 | 2.5 | 180 | 0.81 | 4 | 1.0, 1.6 | 12 | ← |
| 3 Fan-out NAND | 7.5 | 2.5 | 180 | 0.76 | 3 | 1.0, 1.6 | 12 | ← |
| Buffer | 5 | 2.5 | 180 | 0.92 | 10 | 1.7, 2.2 | 6 | → |

Figure 7B:
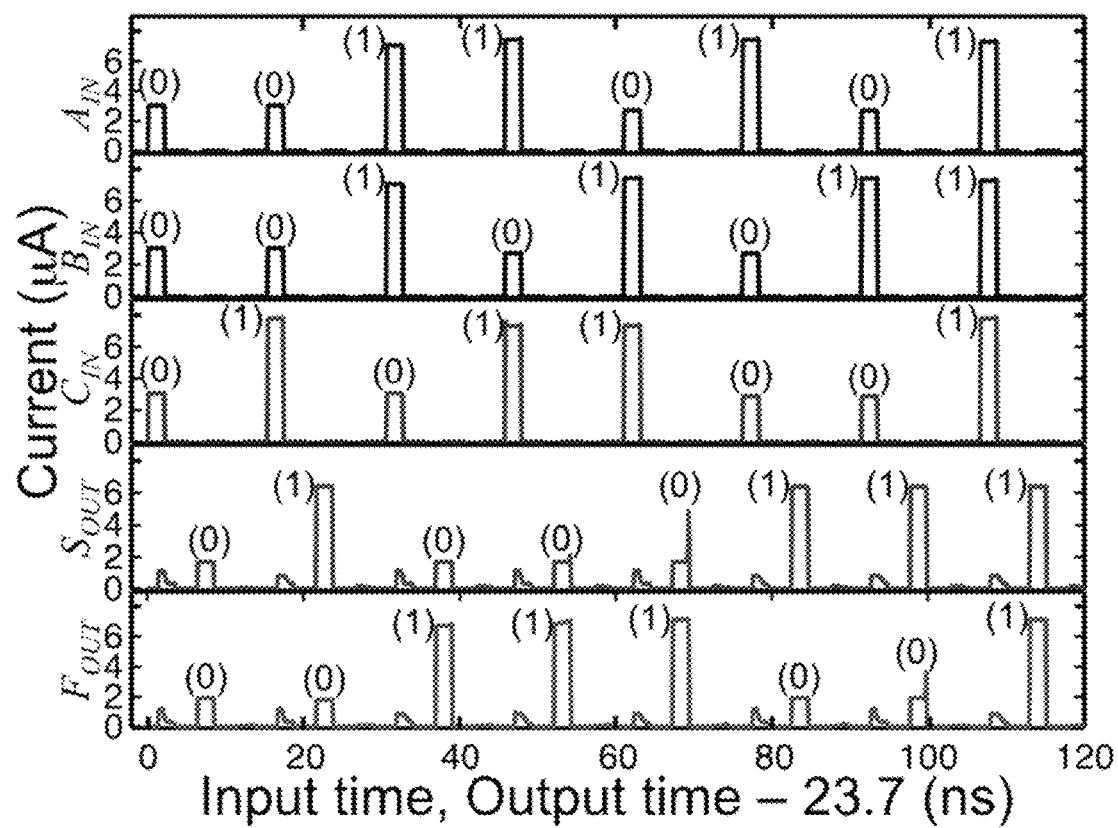
FIG. 7B shows a simulation plot of the current transients for the input and output bits of the full adder shown in FIG. 7A, showing the full adder truth table.
Figure 7C:
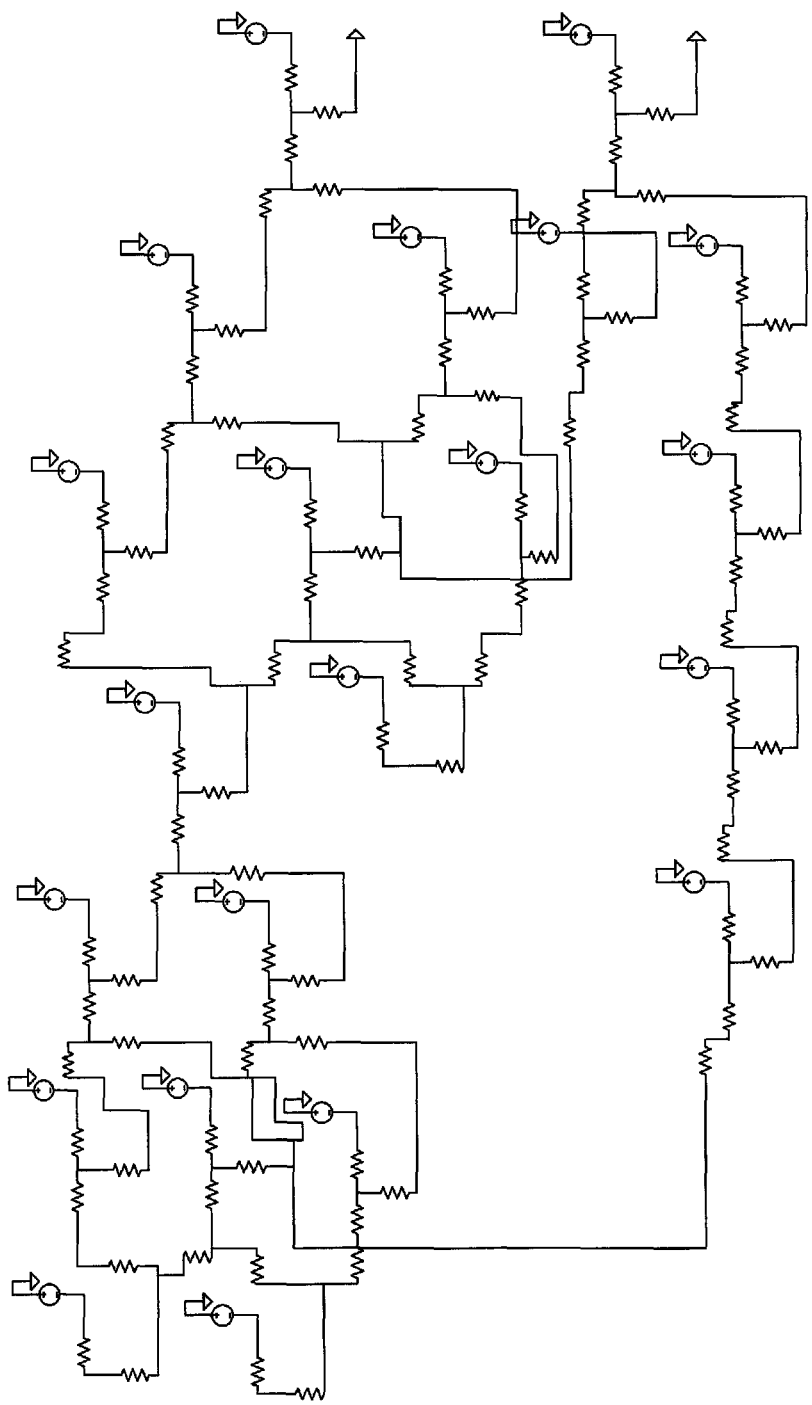
FIG. 7C is a schematic of an equivalent circuit for an embodiment of a full adder in accordance with an embodiment of the invention, which was used in Spice simulations.

To modify the fan-out, $V_{CLK}$ is fixed at 125 mV to maintain a consistent clock voltage and the thickness of the tunnel barrier d is decreased or the area of the MTJ is slightly increased, which reduces $R_p$. The input and output current transients in FIG. 7B successfully reproduce the full adder truth table. Bits 0 and 1 correspond to currents of 2 μA and 6-7 μA, respectively. Negative transients during the isolation clock cycle have been cropped and the output time is displayed offset by 23.7 ns for clarity. FIG. 7C illustrates the Spice model used for the simulations.

The analysis above shows that the proposed magnetic domain wall logic device can be competitive with CMOS at the gate level. The full adder confirms that these low energy gates can operate in computational systems, and are especially suitable for pipelined architectures since the clock is distributed with the power supply.

Optimizations can be performed to improve device and circuit characteristics. Although in the current design, information is read and reset from every device in each complete clock cycle, it should be understood that embodiments are not limited to this methodology. For example, the non-volatility of the information held in the position of the domain wall may be exploited by selectively switching off the clock in areas of the circuit.

EXAMPLE

Reducing Edge Roughness

Figure 8:
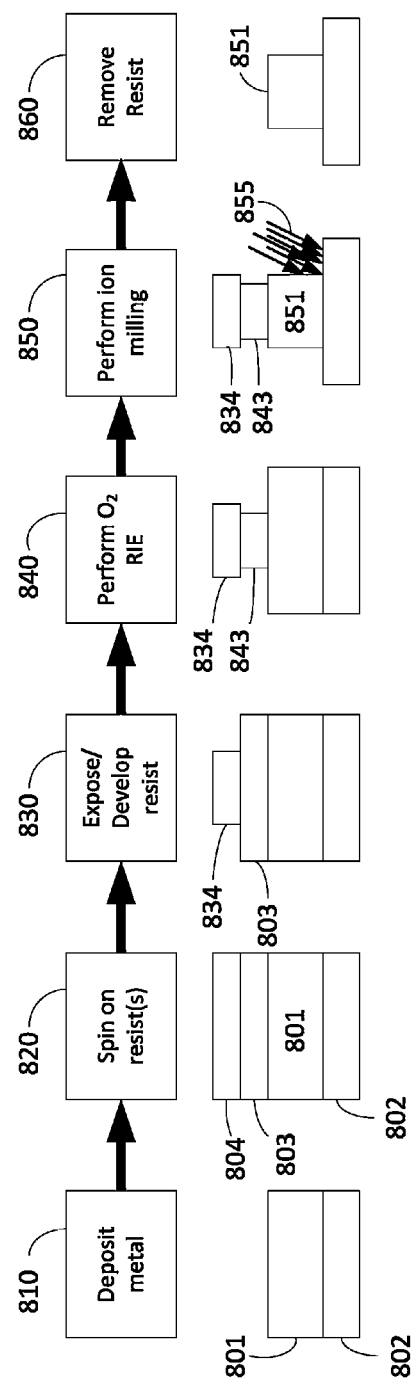
FIG. 8 shows an example process flow for etching soft ferromagnetic wires with low edge roughness.

When fabricating the soft magnetic wire, minimizing edge roughness can promote improved device characteristics. FIG. 8 shows an example process flow for etching soft ferromagnetic wires with low edge roughness. Referring to FIG. 8, metal 801 can be deposited on a substrate through a sputter deposition method (810). The metal 801 may be, for example, CoFe, and the substrate may be, for example, a Si/SiO$_2$ substrate. The IMA or PMA configured layers (including adhesion and magnetic tunnel junction layers) may be deposited as the metal 801.

To provide a pattern mask for etching the metal 801, a poly methyl methacrylate (PMMA) resist 803 and a hydrogen-silesquioxane (HSQ) resist 804 may be formed on the metal 801 as a resist stack through, for example, a spin process (820). The HSQ provides a high-resolution mask, and the PMMA provides the ability to remove the mask after etching using solvents. The PMMA/HSQ resist stack can be used in e-beam lithography. In a first etch mask forming step (830), the HSQ resist 804 can be exposed and developed to form a first pattern mask 834. Then, in a second etch mask forming step (840), the PMMA resist 803 can be patterned through an O$_2$ reactive ion etching (RIE) process to form a second pattern mask 843. The first pattern mask 834 and the second pattern mask 843 can be used as an etch mask during an ion milling process (850) to form a wire 851 from the metal 801. During the ion milling process 850, an ion beam 855 can be used to etch the metal 801. After forming the wire 851, the resists can be removed (860). Solvents may be used to remove the resists.

EXAMPLE

Circuit Architecture: Details of Shift Register Using Three Gates in Series

Figure 9A:
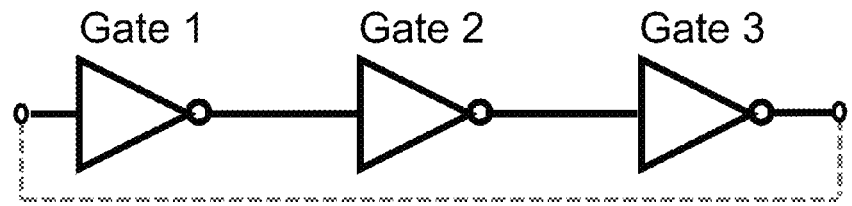
FIG. 9A is a schematic representation of the circuit architecture for a shift register in accordance with an embodiment of the invention.
Figure 9B:
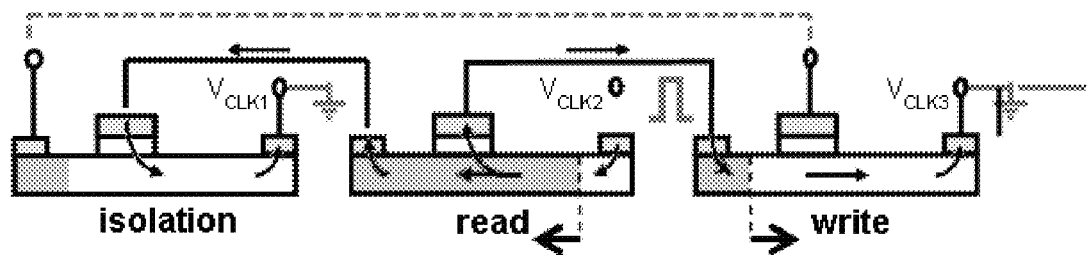
FIGS. 9B-9J illustrate domain wall movement for read/reset, write, and isolation operations for gates of a shift register according to an embodiment of the invention.
Figure 9C:
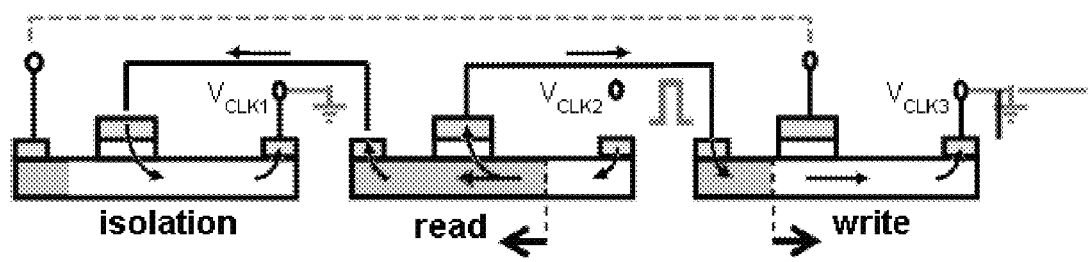
Figure 9D:
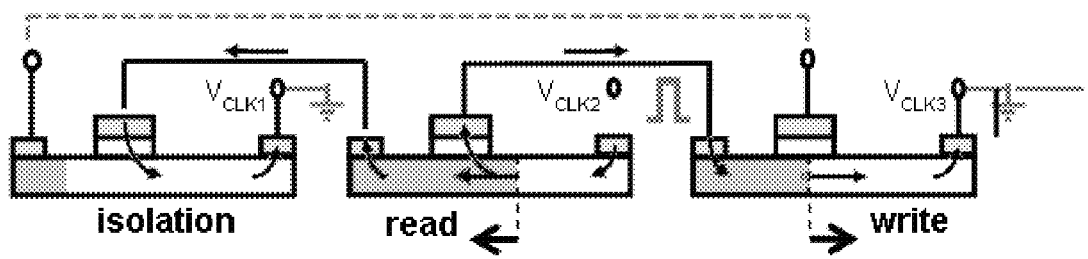
Figure 9E:
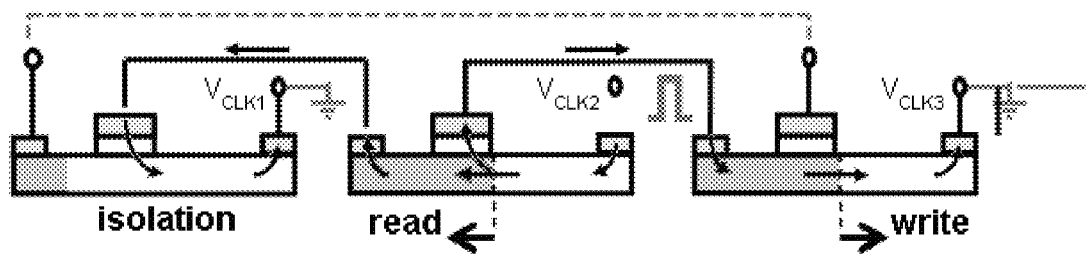
Figure 9F:
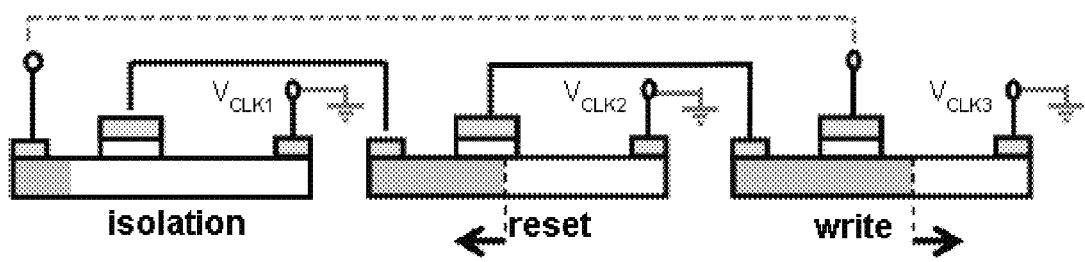
Figure 9G:
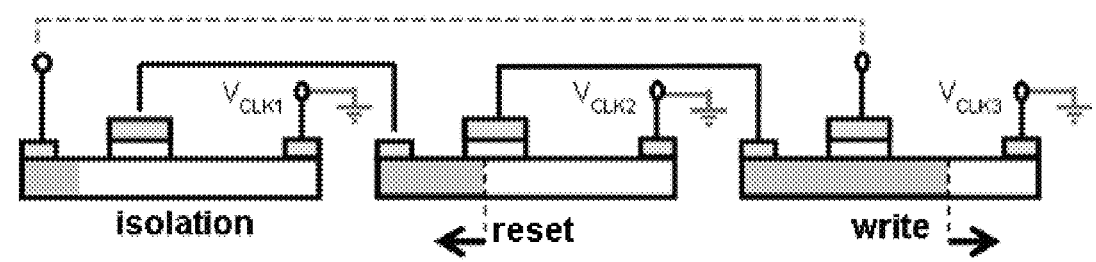
Figure 9H:
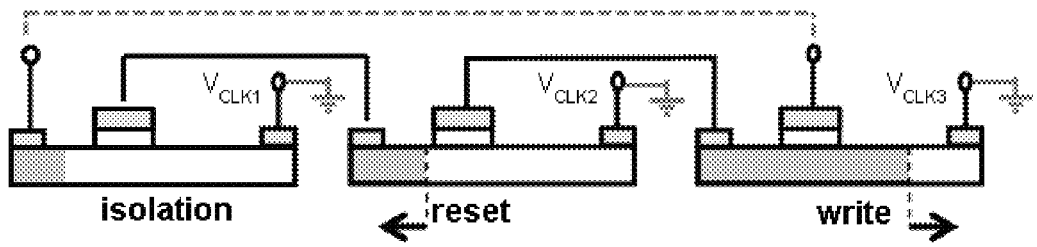
Figure 9I:
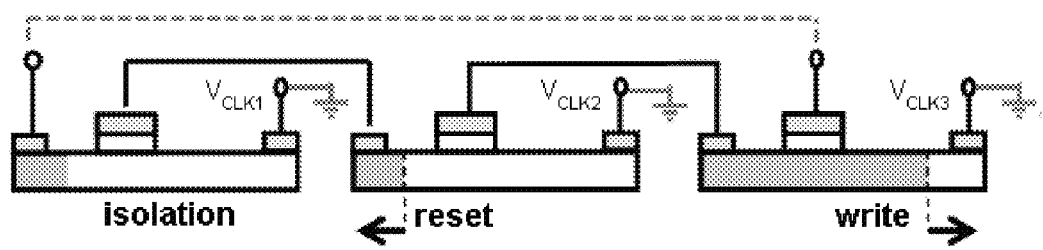

FIG. 9A shows the circuit architecture of three gates connected in series where the gates are configured as inverters. FIG. 9A presents the logic gates of FIG. 6A in another form, but the underlying device structure is the same.

Logic propagation occurs in two steps. During the read step of Gate 2, $V_{CLK2}$ is pulsed while $V_{CLK1}$ and $V_{CLK3}$ remain at ground. Each sequential clock pulse propagates the logic operation and powers the circuit. FIGS. 9B-9J provide the logic operation in more detail. FIGS. 9B-9E illustrate movement of the domain wall through a write operation to Gate 3. The arrows represent electron flow through the MTJ, reading Gate 2 and eventually resetting the domain wall of Gate 2, while writing Gate 3. Current also flows back into Gate 1, but it has been previously reset and is in an isolated state, thus this "leakage" current does not affect the logic position of Gate 1.

Figure 9J:
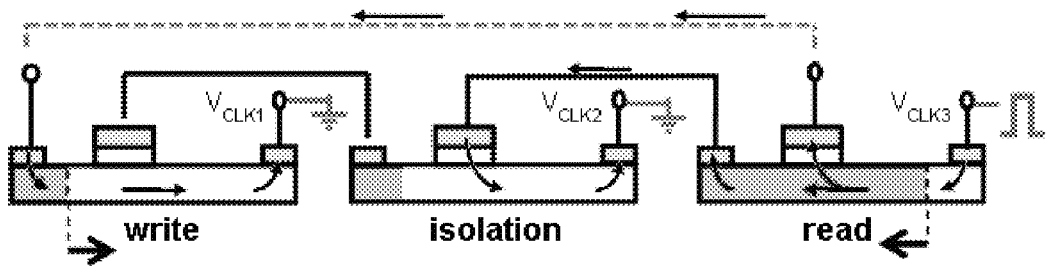

FIGS. 9F-9I illustrate movement of the domain wall through a reset operation of Gate 2. During the reset step, ground can be applied to $V_{CLK1}$, $V_{CLK2}$, and $V_{CLK3}$. The process can repeat in a similar manner in order to write to Gate 1 from Gate 3. This is shown in FIG. 9J where $V_{CLK3}$ is pulsed while $V_{CLK1}$ and $V_{CLK2}$ remain at ground to read from Gate 3.

In accordance with embodiments of the invention, logic based on current-induced domain wall motion can satisfy the requirements of beyond-CMOS logic: it has power gain and concatenability; individual devices are scalable; operating voltages are ~0.1 V for in-plane magnetic anisotropy and ~1 mV for perpendicular magnetic anisotropy; and switching energies can scale below those of contemporary CMOS.

Furthermore, embodiments of the subject device can perform as a universal gate with a complete set of Boolean operations, and can support its own circuits or be integrated with CMOS. The clocking scheme does not necessarily require additional logic transistors at each gate. In addition, embodiments of the subject devices are non-volatile and may be compatible with magnetic memory.

Optimization can be available with regards to the threshold for domain wall motion, the effects of edge roughness and temperature, the behavior of nanoscale MTJs, and improved soft layer materials for low-threshold domain wall motion.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A magnetic domain wall (MDW) logic gate device, comprising:
    a soft ferromagnetic layer having a single magnetic domain wall;
    a magnetic tunnel junction (MTJ) on the soft ferromagnetic layer and having an output terminal thereon connected to a signal line, the MTJ providing an output to the signal line indicative of a logical ZERO or a logical ONE according to a position of the single magnetic domain wall in the soft ferromagnetic layer;
    an input contact configured to receive two or more inputs on the soft ferromagnetic layer at one side of the MTJ; and
    a clock input contact on the soft ferromagnetic layer at the other side of the MTJ from the input contact, the clock input contact coupled to receive a voltage pulse.

2. The MDW logic gate device of claim 1, wherein the position of the single magnetic domain wall is controlled using current applied at the input contact and current from a clock signal applied at the clock input contact.

3. The MDW logic gate device of claim 1, wherein the input contact is configured to receive two input currents as the input to the device, the two input currents each being a high current (IH) or a low current (IL),
    where 2IH>threshold current IT and IL+IH<IT, whereby the output provides a NAND or AND operation of two inputs represented by the two input currents; or
    where 2IL<threshold current IT and IL+IH>IT, whereby the output provides a NOR or OR operation of two inputs represented by the two input currents.

4. The MDW logic gate device of claim 1, wherein the MTJ comprises:
    an insulating tunnel barrier layer on the soft ferromagnetic layer, the insulating tunnel barrier layer being present under only the MTJ, on a portion of the soft ferromagnetic layer including under the MTJ, or on top of the entire ferromagnetic layer; and
    a synthetic antiferromagnetic (SAF) stack on the insulating tunnel barrier layer.

5. The MDW logic gate device of claim 4, wherein the MTJ is offset closer towards the input contact than the clock input contact.

6. The MDW logic gate device of claim 4, wherein the SAF is magnetized in a first direction or a second direction opposite the first direction.

7. The MDW logic gate device of claim 6, wherein the logic gate device is configured as a two-input NAND or AND gate according to the magnetization of the SAF, wherein the input contact is configured to receive two input currents, the two input currents each being a high current (IH) or a low current (IL), where 2IH>threshold current IT and IL+IH<IT.

8. The MDW logic gate device of claim 6, wherein the logic gate device is configured as a two-input NOR or OR gate according to the magnetization of the SAF, wherein the input contact is configured to receive two input currents, the two input currents each being a high current (IH) or a low current (IL), where 2IL<threshold current IT and IL+IH>IT.

9. The MDW logic gate device of claim 1, wherein the soft ferromagnetic layer has a length dimension greater than its width such that the domain wall is transverse.

10. The MDW logic gate device of claim 1, wherein the soft ferromagnetic layer comprises NiFe.

11. The MDW logic gate device of claim 1, wherein the soft ferromagnetic layer comprises CoFe or CoFeB.

12. The MDW logic gate device of claim 1, wherein the soft ferromagnetic layer is configured as an in-plane magnetic anisotropy material.

13. The MDW logic gate device of claim 1, wherein the soft ferromagnetic layer is configured as a perpendicular magnetic anisotropy material.

14. A logic circuit comprising at least two magnetic domain wall (MDW) logic gate devices, each of the at least two MDW logic gate devices comprising:
    a soft ferromagnetic layer having a length greater than its width;
    a magnetic tunnel junction having a tunnel barrier contacting the soft ferromagnetic layer and a synthetic antiferromagnetic (SAF) stack on the tunnel barrier, the magnetic tunnel junction providing an output indicative of a logical ZERO or a logical ONE according to a position of a domain wall in the soft ferromagnetic layer;

an input contact configured to receive two or more inputs on one end of the soft ferromagnetic layer; and a clock input contact on the other end of the soft ferromagnetic layer and coupled to receive a voltage pulse;

wherein a first logic gate device of the at least two MDW logic gate devices receives, at its input contact, the output from a second logic gate device of the at least two MDW logic gate devices.

15. The logic circuit of claim 14, wherein:

the first logic gate is configured to receive a first clock signal at its clock input contact; and the second logic gate is configured to receive a second clock signal at its clock input contact.

16. The logic circuit of claim 15, wherein the first clock signal and the second clock signal are operated such that:

during a read-out operation of the second logic gate, current from the second clock signal flows into the MTJ of the second logic gate, outputting the read-out of a state of the second logic gate to the first logic gate and pushing the domain wall of the second logic gate towards the input contact of the second logic gate;

during a write operation of a state of the first logic gate, the first clock signal is at a ground value and the first logic gate receives the read-out of the state of the second logic gate as an input current through the input contact of the first logic gate, the input current pushing the domain wall of the first logic gate towards the clock input contact of the first logic gate; and after the read-out operation, the second clock signal is at the ground value while the first clock signal is also at the ground value, allowing the domain wall to continue to move towards the input contact to reset the second logic gate.

17. The logic circuit of claim 14, wherein the first logic gate device of the at least two MDW logic gate devices further receives, at its input contact, the output from a third logic gate device of the at least two MDW logic gate devices or an external input signal.

* * * * *